United States Patent
Lee et al.

(10) Patent No.: US 12,050,403 B2
(45) Date of Patent: Jul. 30, 2024

(54) ORGANIC-INORGANIC HYBRID PHOTORESIST PROCESSING LIQUID COMPOSITION

(71) Applicant: YOUNG CHANG CHEMICAL CO., LTD, Gyeongsangbukdo (KR)

(72) Inventors: Su Jin Lee, Daegu (KR); Seung Hun Lee, Daegu (KR); Seung Hyun Lee, Daegu (KR)

(73) Assignee: YOUNG CHANG CHEMICAL CO., LTD, Gyeongsangbuk-do (KR)

(*) Notice: Subject to any disclaimer, the term of this patent is extended or adjusted under 35 U.S.C. 154(b) by 376 days.

(21) Appl. No.: 17/264,584

(22) PCT Filed: Jul. 5, 2019

(86) PCT No.: PCT/KR2019/008300
§ 371 (c)(1),
(2) Date: Jan. 29, 2021

(87) PCT Pub. No.: WO2020/032398
PCT Pub. Date: Feb. 13, 2020

(65) Prior Publication Data
US 2021/0333709 A1    Oct. 28, 2021

(30) Foreign Application Priority Data
Aug. 6, 2018  (KR) .................. 10-2018-0091227

(51) Int. Cl.
*G03F 7/004* (2006.01)
*G03F 7/20* (2006.01)

(52) U.S. Cl.
CPC .......... *G03F 7/0045* (2013.01); *G03F 7/0042* (2013.01); *G03F 7/0048* (2013.01); *G03F 7/2004* (2013.01)

(58) Field of Classification Search
None
See application file for complete search history.

(56) References Cited

U.S. PATENT DOCUMENTS

| | | | | |
|---|---|---|---|---|
| 5,897,958 A * | 4/1999 | Yamada | ............... | B01J 31/0212 502/340 |
| 6,500,605 B1 | 12/2002 | Mullee et al. | | |
| 8,057,696 B2 * | 11/2011 | Chelle | ..................... | C09G 1/02 438/492 |
| 2002/0068685 A1 * | 6/2002 | Wojtczak | ................. | G03F 7/426 257/E21.228 |
| 2003/0059544 A1 * | 3/2003 | Bravo-Vasquez | ............................ | C23C 18/1279 427/508 |
| 2005/0187118 A1 * | 8/2005 | Haraguchi | ............... | C11D 7/10 134/2 |
| 2008/0269096 A1 | 10/2008 | Visintin et al. | | |
| 2012/0208125 A1 * | 8/2012 | Hatakeyama | ......... | G03F 7/0043 430/296 |
| 2014/0295172 A1 * | 10/2014 | Doi | .......................... | B05D 1/38 428/332 |
| 2015/0232674 A1 * | 8/2015 | Yukinobu | ........... | C23C 18/1283 252/519.21 |
| 2016/0349616 A1 | 12/2016 | Nakagawa et al. | | |
| 2017/0237005 A1 * | 8/2017 | Weitz | ................... | H10K 85/111 438/99 |

FOREIGN PATENT DOCUMENTS

| | | | | |
|---|---|---|---|---|
| CN | 1683487 A | 10/2005 | | |
| CN | 106832304 A * | 6/2017 | ............. | C04B 35/48 |
| GB | 975369 A1 * | 11/1964 | | |
| JP | 04300903 A | 10/1992 | | |
| JP | 05-259140 A | 10/1993 | | |
| JP | H067444 B * | 1/1994 | | |
| JP | 08143773 A | 6/1996 | | |
| JP | 2000231200 A | 8/2000 | | |
| JP | 2001-330970 A | 11/2001 | | |
| JP | 2004165399 A * | 6/2004 | | |
| JP | 2008070480 A * | 3/2008 | ............. | G03F 7/004 |
| JP | 2009088028 A | 4/2009 | | |
| KR | 10-2005-0076756 A | 7/2005 | | |
| KR | 20070120609 A | 12/2007 | | |
| KR | 10-1910157 B1 | 10/2018 | | |
| WO | 2015137193 A1 | 9/2015 | | |
| WO | WO-2016043200 A1 * | 3/2016 | ........... | G03F 7/0042 |

OTHER PUBLICATIONS

Rout et al., Molecular interaction study on binary mixtures or acetylacetone form excess properties of ultrasonic velocity, viscosity, and density at various temperatures, Indian J. Chem., vol. 33A pp. 303-307 (Apr. 1994).*
Poliak et al., "CP water soluble Flux" NN69021150 (Year: 1969).*

* cited by examiner

*Primary Examiner* — Martin J Angebranndt
(74) *Attorney, Agent, or Firm* — NKL LAW; Jae Youn Kim

(57) ABSTRACT

Proposed are an organic-inorganic hybrid photoresist processing solution composition for use in a thin film formation process, a development process, and a stripping process of an organic-inorganic hybrid photoresist, and a processing method using the same. The processing solution composition includes a compound of Chemical Formula 1 and a ketone, an ester, an ether, an additive or a mixture thereof, and is superior in processing of organic materials and ability to adsorb inorganic materials, thereby minimizing the remaining inorganic material content, ultimately preventing processing defects from occurring.

3 Claims, No Drawings

ORGANIC-INORGANIC HYBRID PHOTORESIST PROCESSING LIQUID COMPOSITION

CROSS-REFERENCE TO RELATED APPLICATIONS

This application is a national stage entry under 35 USC 371 of PCT/KR2019/008300, filed Jul. 5, 2019, which claims priority to KR 10-2018-0091227, filed Aug. 6, 2018, the disclosure of which is incorporated by reference herein in its entirety.

TECHNICAL FIELD

The present disclosure relates to a processing solution composition that is appropriate for use in forming an organic-inorganic hybrid photoresist on a substrate or in processing the formed organic-inorganic hybrid photoresist, and to a method of processing an organic-inorganic hybrid photoresist using the processing solution composition.

BACKGROUND ART

Photoresists have been employed in semiconductor processing for a long time. However, as a miniaturization process continues, the exposure source of a photoresist capable of miniaturization is changed, and accordingly, the material for the photoresist is also changed. Materials suitable for processes using KrF, ArF, ArF immersion, and EUV light sources, as well as photoresists using Mine light sources, have been developed. However, because materials specialized and suitable for fine patterning are used, there occur problems in which physical properties such as etching resistance and the like of these materials deteriorate, and thus the use of organic-inorganic hybrid materials has emerged as an application. Since organic-inorganic hybrid materials such as polysiloxane, polysilazane and the like have a variety of superior properties, they are used in semiconductor processing as materials for gap fillers and antireflective films, but such hybrid materials are not photosensitive, so they are not directly used as patterning materials.

However, materials capable of patterning are being developed these days by manufacturing organic-inorganic hybrid materials using cobalt, hafnium, tin, and antimony, and in order to apply such materials to semiconductor processing, a chemical solution that enables processing thereof is required.

Typically, when forming a photosensitive film by applying a photoresist solution through a spinning process, an edge-rinsing process is simultaneously performed, and at the same time, a back-rinsing process is performed to prevent contamination of the back side of the wafer. In addition, a development process is performed after exposure of the applied photoresist. In addition, when problems occur after formation of the coating film or when the photoresist film is to be removed after completion of processing, a process of stripping, cleaning, or rinsing is required.

Existing photoresists are made of organic materials, but there is a need for a new material composition in order to process organic-inorganic hybrid photoresists that are recently developed. Therefore, the present disclosure is intended to provide a processing solvent having no problem in the process of forming a coating film of an organic-inorganic hybrid photoresist and the process of stripping, cleaning and rinsing thereof, and a method of processing an organic-inorganic hybrid photoresist using the same. Moreover, since the organic-inorganic hybrid photoresist contains an inorganic material, the processing solvent of the present disclosure has to exhibit high solubility thereof and high ability to remove the inorganic material. In addition, the present disclosure is intended to provide a processing solvent that does not affect the coating film of a photoresist and a processing method using the same.

DISCLOSURE

Technical Problem

The present disclosure has been made keeping in mind the problems encountered in the related art, and an objective of the present disclosure is to provide a processing solvent having superior performance, which does not affect the formation of a coating film during a patterning process using an organic-inorganic hybrid photoresist, is capable of preventing contamination of a wafer substrate through edge rinsing or back rinsing and performing a development process after an exposure process, and does not cause particle problems in the process of stripping, cleaning and rinsing after incorrect application of the organic-inorganic hybrid photoresist or completion of processing, and a processing method using the same.

Technical Solution

The present disclosure provides a stripping, cleaning and rinsing solution composition for processing an organic-inorganic hybrid photoresist, in an edge-rinsing process and a back-rinsing process performed simultaneously with applying the organic-inorganic hybrid photoresist, a development process after exposure, and a rework process for removing the photoresist, during the process using the organic-inorganic hybrid photoresist.

The organic-inorganic hybrid photoresist composition is a material used in the patterning process performed through irradiation with EUV, ArF and KrF lasers, and may contain an inorganic material, including cobalt (Co), antimony (Sb), hafnium (Hf), palladium (Pd), tin (Sn), or combinations thereof, or may be composed of an organic ligand and a cationic inorganic ligand.

The organic-inorganic hybrid photoresist processing solution composition is a composition including the compound of Chemical Formula 1 below.

[Chemical Formula 1]

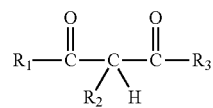

In Chemical Formula 1, $R_1$, $R_2$ and $R_3$ are each independently an alkyl group having 1 to 6 carbon atoms, a benzyl group, or an alkyl alcohol group.

The organic-inorganic hybrid photoresist processing solution composition may include:
 i) the compound of Chemical Formula 1; and
 ii) a ketone, an ester, an ether, an additive, or a mixture thereof.

In the organic-inorganic hybrid photoresist processing solution composition, the compound of Chemical Formula 1 is preferably acetylacetone.

The ketone may include 2-heptanone, cyclohexanone, cyclopentanone, or combinations thereof.

The ester may include propylene glycol monomethyl ether acetate, methoxymethyl propionate, ethoxyethyl propionate, gamma-butyrolactone, ethyl lactate, hydroxyisobutyric acid methyl ester, or combinations thereof.

The ether may include propylene glycol monomethyl ether.

As the additive, a chelating agent or a surfactant may be applied, and the chelating agent may include an ionic liquid, dihydroxybenzoic acid, oxalic acid, citric acid, malic acid, tartaric acid, or combinations thereof, and the surfactant may include polypropylene glycol or polyaspartic acid, suitable for use in the organic-inorganic hybrid photoresist processing solution.

Advantageous Effects

Solutions for processing existing photoresists have been developed and are appropriately used in many processes.

However, since organic-inorganic hybrid photoresists include inorganic materials, failure to remove such inorganic materials causes processing problems such as particle problems or etching defects in a subsequent dry etching process.

Hence, it is necessary for a processing solution capable of removing, cleaning and rinsing both organic and inorganic materials.

According to the present disclosure, an organic-inorganic hybrid photoresist processing solution composition has high performance in processing of organic materials and high ability to adsorb inorganic materials, and thus the remaining inorganic material content can be minimized in the process of forming and removing the above coating film, thereby preventing processing defects from occurring.

BEST MODE

Unless otherwise defined, all technical and scientific terms used herein have the same meanings as those typically understood by those skilled in the art to which the present disclosure belongs. Generally, the nomenclature used herein is well known in the art and is typical.

With the miniaturization of semiconductor devices, exposure sources at short wavelengths have been developed, and accordingly, photoresists capable of responding to short wavelengths have been developed. As patterns have become finer, the thickness of the photoresist film has been gradually reduced.

However, dry-etching resistance is sometimes insufficient at such a reduced film thickness. Hence, hard mask materials are applied, but due to the increase in the number of processes, it is required to develop a photoresist having high dry-etching resistance.

Accordingly, a method of increasing dry-etching resistance by applying an organic-inorganic hybrid photoresist is being developed. The organic-inorganic hybrid photoresist is used by synthesizing an organic material with an inorganic material such as cobalt (Co), antimony (Sb), hafnium (Hf), palladium (Pd), tin (Sn), or the like, and may be composed of an anionic organic ligand and a cationic inorganic ligand. Therefore, failure to completely remove the inorganic material in the process of applying or removing the organic-inorganic hybrid photoresist containing the inorganic material may lead to processing defects due to particle problems.

Applying the organic-inorganic hybrid photoresist is a step of applying a photosensitive film to form a pattern. While a liquid photoresist is applied through a spin-coating process, edge rinsing of the edge of a wafer and back rinsing of the back side of the wafer are performed, thereby removing the photoresist residue.

If organic or inorganic particles remain due to incomplete edge rinsing, these particles may be transferred to the inside of the wafer in subsequent processing, which may cause processing defects. If the back rinsing is incomplete, the chuck that moves the wafer in a photo device may become contaminated and thus the device may malfunction, which may cause device problems. Hence, there is the need for a process of removing such particles and a processing solution therefor.

The processing solution may be used in the development process after exposure of the organic-inorganic hybrid photoresist.

In existing semiconductor photoresists, 2.38% TMAH has been the most widely used, but LER (line edge roughness) becomes an issue with an increase in pattern fineness. If LER is poor, micro-bridges may form, which may cause processing defects in the subsequent dry etching process. Hence, rather than using an alkali solution as a developer, the photoresist may be formed using a negative tone and an organic solvent may be used as the developer, whereby LER may be improved. Therefore, the present processing solution may also be applied as the developer.

After the formation of the photoresist thin film, in the case in which the thin film is incorrectly formed, there is a need to rework, clean, or rinse the photoresist. Here, a process and a processing solution capable of completely removing the thin film without the presence of inorganic particles are required.

As a technical method for processing the organic material, a process using solvation or permeability is mainly used. However, in order to process the organic-inorganic hybrid material, it is additionally necessary to process the inorganic material. Chelating is the best way to remove the inorganic material.

Then, the best way to process a mixture of organic and inorganic materials is to have high solubility of the organic material and high chelating performance for the inorganic material.

The organic-inorganic hybrid photoresist processing solution according to an embodiment of the present disclosure includes a compound represented by Chemical Formula 1, and is a composition capable of being used in a thin film formation process, a development process, and a stripping process of the organic-inorganic hybrid photoresist.

[Chemical Formula 1]

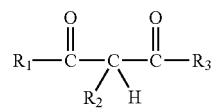

In Chemical Formula 1, $R_1$, $R_2$ and $R_3$ are each independently an alkyl group having 1 to 6 carbon atoms, a benzyl group, or an alkyl alcohol group.

In the organic-inorganic photoresist processing solution composition, the compound of Chemical Formula 1 is preferably acetylacetone.

The structure of acetylacetone is famous as an organic compound that converts quickly into two tautomeric forms. The pair of two tautomers may be rapidly interconverted, and may thus be regarded and used as a single material in various processes.

Due to the structural feature thereof, acetylacetone has a complex structure with many metals. The structure, called a metal acetylacetonate complex, is very easily formed and has been used in the synthesis of metal ligands and the like.

It is known that lithium (Li), sodium (Na), potassium (K), copper (Cu), silver (Ag), titanium (Ti) and cesium (Cs) form a 1:1 complex with acetylacetone, that beryllium (Be), calcium (Ca), barium (Ba), zinc (Zn), mercury (Hg), chromium (Cr), manganese (Mn), iron (Fe), cobalt (Co), nickel (Ni), copper (Cu), magnesium (Mg), strontium (Sr), palladium (Pd), platinum (Pt) and lead (Pb) form a 1:2 complex with acetylacetone, that scandium (Sc), yttrium (Y), cesium (Ce), vanadium (V), chromium (Cr), molybdenum (Mo), manganese (Mn), rhenium (Re), iron (Fe), ruthenium (Ru), cobalt (Co), rhodium (Rh), iridium (Ir), aluminum (Al), gallium (Ga) and indium (In) form a 1:3 complex with acetylacetone, and that zirconium (Zr), hafnium (Hf), thorium (Th), uranium (U), plutonium (Pu) and cerium (Ce) form a 1:4 complex with acetylacetone. The above have high solubility of organic materials and superior properties for use in a processing solution in processing.

The organic-inorganic hybrid photoresist processing solution composition may be used by mixing:
i) the compound of Chemical Formula 1 and ii) a ketone, an ester, an ether, an additive, or a mixture thereof.

For the processing suitability of the organic-inorganic hybrid photoresist processing solution, it is necessary to adjust the volatility and viscosity of the processing solution. As such, organic solvents, such as ketones, esters, and ethers, may be mixed and used, and additionally, in order to improve the rate of dissolution of organic materials, a mixture thereof may be used.

The ketone may include 2-heptanone, cyclohexanone, cyclopentanone, or combinations thereof.

The ester may include propylene glycol monomethyl ether acetate, methoxymethyl propionate, ethoxyethyl propionate, gamma-butyrolactone, ethyl lactate, hydroxyisobutyric acid methyl ester, or combinations thereof.

The ether may include propylene glycol monomethyl ether.

As the additive, a chelating agent or a surfactant may be applied.

The chelating agent may be applied as an additive that complements chelating performance for the inorganic material, and may include an ionic liquid, dihydroxybenzoic acid, oxalic acid, citric acid, malic acid, tartaric acid, or combinations thereof, and the surfactant may include polypropylene glycol or polyaspartic acid, suitable for use in the organic-inorganic hybrid photoresist processing solution.

In the organic-inorganic hybrid photoresist processing solution according to the present disclosure and the processing method using the same, the application process may be performed by a method known in the art.

A better understanding of the present disclosure may be obtained through the following Examples, Comparative Examples and Test Examples. However, the following Examples, Comparative Examples, and Test Examples are merely set forth to illustrate the present disclosure, and the scope of the present disclosure is not to be construed as being limited by these Examples, Comparative Examples and Test Examples, but may be variously modified and changed, as will be apparent to those skilled in the art.

Mode for Disclosure

Examples and Comparative Examples

The components of Examples and Comparative Examples in the amounts shown in Table 1 below were placed in each test beaker equipped with a magnetic bar, after which the top of the beaker was sealed, followed by stirring at room temperature for 30 minutes at a rate of 400 rpm, thereby preparing individual processing solution compositions.

TABLE 1

| Classification | AA | PGMA | PGME | EL | MAKN | OA | EMHA | PAA | PPG |
|---|---|---|---|---|---|---|---|---|---|
| Example 1 | 100 | | | | | | | | |
| Example 2 | 70 | 30 | | | | | | | |
| Example 3 | 70 | 25 | | | | 5 | | | |
| Example 4 | 70 | | 30 | | | | | | |
| Example 5 | 70 | | | 30 | | | | | |
| Example 6 | 70 | | | | 30 | | | | |
| Example 7 | 95 | | | | | 5 | | | |
| Example 8 | 99 | | | | | | 1 | | |
| Example 9 | 99 | | | | | | | 1 | |
| Example 10 | 99 | | | | | | | | 1 |
| Example 11 | 70 | | 25 | | | 5 | | | |
| Example 12 | 70 | | 29 | | | | 1 | | |
| Example 13 | 70 | | 29 | | | | | 1 | |
| Comparative Example 1 | | 100 | | | | | | | |
| Comparative Example 2 | | | 100 | | | | | | |
| Comparative Example 3 | | | | 100 | | | | | |
| Comparative Example 4 | | | | | 100 | | | | |
| Comparative Example 5 | | 30 | 70 | | | | | | |
| Comparative Example 6 | | | 99 | | | | 1 | | |

AA: acetylacetone
PGMA: propylene glycol monomethyl ether acetate
PGME: propylene glycol monomethyl ether
EL: ethyl lactate
MAKN: 2-heptanone
OA: oxalic acid
EMHA: 1-ethyl-3-methylimidazolium hydrogen sulfate
PAA: polyaspartic acid
PPG: polypropylene glycol

Test Examples

1. Preparation of Organic-Inorganic Hybrid Compound 3 wt % of each of three organic-inorganic hybrid compounds, specifically dibutyltin maleate (DTM), dibutyltin dilaurate (DTD), and dibutyltin diacetate (DTA), was mixed with propylene glycol monomethyl ether in a beaker, after which the top of the beaker was sealed, followed by stirring at room temperature for 30 minutes at a rate of 300 rpm to prepare a composition.

2. Evaluation of EBR Performance

In order to evaluate the edge-cutting performance of the organic-inorganic hybrid compound processing solvent prepared in each of Examples and Comparative Examples, evaluation was performed while applying the DTD solution prepared as described above on an 8-inch silicon wafer through spin coating. The performance of removal of beads was evaluated using an optical microscope, and the results thereof are shown in Table 2 below.

[Evaluation Criteria]
- ⊚: EBR side has uniform straightness and is in a constant and very good state
- ○: EBR side has straightness of 75% or more and is in a good state
- Δ: EBR side has straightness of 50% or more is in a fair state
- X: EBR side has straightness less than 50% and is in a poor state

3. Evaluation of Performance of Removal of Organic-Inorganic Hybrid Compound In order to evaluate the performance of removal of the organic-inorganic hybrid compound with the organic-inorganic hybrid compound processing solvent prepared in each of Examples and Comparative Examples, each of the prepared DTM, DTD, and DTA solutions was applied through spin coating on an 8-inch silicon wafer to form a film. Then, the processing solvent was discharged in an amount of 1 liter per minute on the center of the wafer to remove the organic-inorganic hybrid compound, followed by immersion in a 100:1 DHF solution. Then, the remaining tin content was determined through elemental analysis of the DHF solution and converted into a number of tin atoms per unit area of the wafer. The results thereof are shown in Table 2 below.

TABLE 2

| Classification | EBR performance | Number of remaining tin atoms (EA * 1011/cm$^2$) | | |
| --- | --- | --- | --- | --- |
| | | DTM | DTD | DTA |
| Example 1 | ○ | 2.3 | 5.2 | 1.4 |
| Example 2 | ⊚ | 3.3 | 4.8 | 1.7 |
| Example 3 | ⊚ | 2.1 | 4.2 | 0.9 |
| Example 4 | ⊚ | 3.2 | 4.8 | 2.2 |
| Example 5 | ⊚ | 3.6 | 6.1 | 1.8 |
| Example 6 | ⊚ | 2.9 | 5.4 | 2.2 |
| Example 7 | ○ | 1.2 | 2.5 | 1.1 |
| Example 8 | ○ | 1.4 | 3.6 | 1.3 |
| Example 9 | ○ | 1.7 | 2.7 | 0.8 |
| Example 10 | ○ | 1.3 | 2.1 | 0.4 |
| Example 11 | ⊚ | 1.1 | 1.8 | 0.7 |
| Example 12 | ⊚ | 0.9 | 1.5 | 0.5 |
| Example 13 | ⊚ | 1.2 | 1.7 | 1.1 |
| Comparative Example 1 | ○ | 32.8 | 120.0 | 28.3 |
| Comparative Example 2 | ○ | 20.4 | 90.2 | 23.6 |
| Comparative Example 3 | X | 48.7 | 123.3 | 39.2 |
| Comparative Example 4 | Δ | 24.6 | 98.2 | 24.8 |
| Comparative Example 5 | ⊚ | 36.4 | 120.9 | 30.3 |
| Comparative Example 6 | ○ | 18.4 | 110.1 | 21.4 |

DTM: dibutyltin maleate
DTD: dibutyltin dilaurate
DTA: dibutyltin diacetate

As described hereinbefore, the processing solution composition according to the present disclosure is suitable for use as a processing solution for an organic-inorganic hybrid photoresist because it has high solubility of an organic-inorganic mixture and high edge-cutting ability and has properties and stability suitable for use in semiconductor processing.

The invention claimed is:

1. A process liquid composition for treating an organic/inorganic hybrid photoresist, the process liquid composition used in a thin film forming process, a developing process, and a peeling process for the organic/inorganic hybrid photoresist, the process liquid composition comprising:
   70 wt % of acetyl acetone (AA);
   25 wt % or 29 wt % propylene glycol monomethyl ether (PGME); and
   5 wt % of oxalic acid (OA) or 1 wt % of 1-ethyl-3-methylimidazolium hydrogen sulfate (EMHA) or 1 wt % of poly aspartic acid (PAA).

2. The process liquid composition according to claim 1, wherein an inorganic material of the organic/inorganic hybrid photoresist is selected from the group consisting of cobalt (Co), antimony (Sb), hafnium (Hf), palladium (Pd), tin (Sn), and a mixture thereof.

3. The process liquid composition according to claim 1, wherein the process liquid composition is used as a developer solution or a resist peeling solution for organic/inorganic photoresists which have been irradiated by an electron beam, EUV, ArF, and KrF laser.

* * * * *